United States Patent [19]

Tahara

[11] Patent Number: 4,983,922
[45] Date of Patent: Jan. 8, 1991

[54] MAGNETIC SHIM FOR MAGNETIC FIELD CORRECTION

[75] Inventor: Yasuyuki Tahara, Ako, Japan
[73] Assignee: Mitsubishi Denki Kabushiki Kaisha, Tokyo, Japan
[21] Appl. No.: 360,692
[22] Filed: Jun. 2, 1989
[30] Foreign Application Priority Data

Jun. 3, 1988 [JP] Japan ................................ 63-135545

[51] Int. Cl.$^5$ ............................................. G01R 33/20
[52] U.S. Cl. ...................................... 324/320; 324/318
[58] Field of Search ................. 335/216, 296, 299; 324/300, 307, 309, 318, 319, 320, 322

[56] References Cited

U.S. PATENT DOCUMENTS 4,710,741 12/1987 McGinley ............................ 324/320

FOREIGN PATENT DOCUMENTS 109846 5/1888 Japan .
0216404 4/1987 United Kingdom .
2184243 6/1987 United Kingdom .

OTHER PUBLICATIONS

Magnetic Field Profiling: Analysis and Correcting Coil Design, Magnetic Resonance in Medicine 1, 44-65 (1984).
Superconducting Magnets for MRI, IEEE Trans. on Nuclear Science vol. NS-31, No. 4, Aug. 1984.
Romeo, Francoise et al., Magnetic Resonance in Medicine 1 (1984) 44-65, particularly p. 54.

*Primary Examiner*—Michael J. Tokar
*Attorney, Agent, or Firm*—Sughrue, Mion, Zinn, Macpeak & Seas

[57] ABSTRACT

A magnetic shim for correcting the n-th order harmonic of the Z-axis component of the main magnetic field of an NMR device has its end surfaces disposed such that each of the (n+2)-order harmonics of the magnetic fields generated by the end surfaces are nonzero and such that the sum of the (n+2)-order harmonics is equal to zero.

3 Claims, 2 Drawing Sheets

MAGNETIC SHIM FOR MAGNETIC FIELD CORRECTION

BACKGROUND OF THE INVENTION

This invention relates to a magnetic shim for correcting a magnetic field so as to obtain a magnetic field of greater uniformity. More particularly but not exclusively, it relates to a magnetic shim for correcting the main magnetic field in an NMR (nuclear magnetic resonance) apparatus.

In an NMR apparatus, it is desirable that the main magnetic field be highly uniform in the region of an object which is being measured by NMR. One convenient and inexpensive method of correcting a magnetic field is the use of passive shims. A shim is a ring or cylinder of a magnetic material such as iron which is disposed in the main magnetic field of the NMR apparatus. The shim is magnetized by the main magnetic field and generates its own magnetic field which can compensate for a certain harmonic of the main magnetic field and increase the uniformity of the main magnetic field.

FIG. 1 is a longitudinal cross-sectional view of a portion of an NMR apparatus which employs a conventional iron shim. The NMR apparatus has a superconducting main coil 1 which generates a main magnetic field in the direction of the Z-axis. The main coil 1 is housed inside a cryostat 2 which includes a liquid helium tank or the like. The cryostat 2 has a room temperature bore 3 formed at its center into which an unillustrated object which is being measured is inserted. A pair of cylindrical iron shims 4 are coaxially disposed inside the bore 3 along the Z axis in symmetry with respect to an origin O. The Z coordinates of the end surfaces 4A and 4B of each shim 4 are $Z_1$ and $Z_2$, respectively. The angles $\theta$ between the Z axis and straight lines which connect ends 4A and 4B with the origin O are respectively $\theta_1$ and $\theta_2$, and the length of each iron shim 4 along the Z axis is $L_1$.

Next, the operation of the iron shims 4 shown in FIG. 1 will be explained while referring to FIG. 2, which illustrates a portion of the iron shim 4 in an X-Z coordinate system. The case will be explained in which the iron shims 4 are cylindrical and are in a state of complete magnetic saturation due to the main magnetic field generated by the main coil 1. It will further be assumed that the component of the magnetic field due to magnetization (or the magnetic charge) of both end surfaces 4A and 4B is in the direction of the Z axis.

Normally, the main magnetic field which is generated by the main coil 1 contains, in addition to a zero-order harmonic $B_{zo}$ in the direction of the Z axis, a higher-order error field $\Delta B_z(X,Y,Z)$ which has a component $\Delta B_z(Z)$ in the direction of the Z axis. This Z-axis component is expressed by the following equation, in which $C_1, C_2, C_3$, etc. are constants corresponding to higher-order harmonics:

$$\Delta B_z(Z) = C_1 Z + C_2 Z^2 + C_3 Z^3 + \ldots \quad (1)$$

As shown in FIG. 2, the magnetic field $B_{z1}$ which is generated in the direction of the Z axis at the coordinate Z due to the magnetization J1 of one end surface 4A of the iron shim 4 is expressed by the following equation:

$$B_{z1} = B_s \cdot A \cdot \cos\theta_1 / 4\pi r_1^2 \ldots \quad (2)$$

$B_s$ is the saturation flux density of the iron shim 4, A is the cross-sectional area of the end surface 4A, and $r_1$ is the distance of the end surface 4A from the coordinate Z. The product ($J_1 A$) of the magnetization $J_1$ and the cross-sectional area A is referred to as the magnetic charge. In FIG. 2, only a portion of the iron shim 4 is illustrated. If the radius of the iron shim 4 is a, then the distance $r_1$ from the coordinate Z and $\cos\theta_1$ are expressed by the following formulas:

$$r_1 = \sqrt{(Z_1 - Z)^2 + a^2}$$

$$\cos\theta_1 = (Z_1 - Z)/r_1$$
$$= (Z_1 - Z)/\sqrt{(Z_1 - Z)^2 + a^2}$$

Therefore, Equation (2) can be rewritten as follows:

$$B_{z1} = B_s \cdot A \cdot (Z_1 - Z)\{(Z_1-Z)^2 + a^2\}^{-3/2}/4\pi \ldots \quad (3)$$

In general, the main magnetic field at the coordinate Z can be expressed as a Maclaurin series. If Equation (3) is generalized and expressed as a Maclaurin series, then the magnetic field $B_z$ at an arbitrary point Z which is generated by the magnetic charge on the end surface having a Z coordinate ($Z_1$) is given by the following summation for $k=0$ to $\infty$:

$$B_z = \Sigma [(1/k!)(\partial B_{z1}/\partial Z^k)_{Z=0}] Z^k \ldots \quad (4)$$

Combining Equations (3) and (4) gives the following equation:

$$B_z = B_{zs}[\epsilon_0 + \epsilon_1(Z/a) + \epsilon_2(Z/a)^2 + \ldots] \quad (5)$$
$$= B_{zs}\Sigma \epsilon_k (Z/a)^k$$

wherein $B_{zs} = B_s \cdot A / 4\pi a^2$. Furthermore, if $$S = \sin\theta = a/R$$

$$U = \cos\theta = Z_1/R,$$

where R is the distance of the end surface 4A from the origin O, Then the coefficients $\epsilon_0, \epsilon_1$, etc. for each term are expressed as follows:

$$\epsilon_0 = S^2 U$$

$$\epsilon_1 = S^3(S^2 - 2U^2)$$

$$\epsilon_2 = (3/2)S^4 U(-3S^2 + 2U^2)$$

$$\epsilon_3 = (\tfrac{1}{2})S^5(-3S^4 + 24S^2 U^2 - 8U^4)$$

$$\epsilon_4 = (5/8)S^6 U(15S^4 - 40U^2 S^2 + 8U^4) \text{ etc.} \ldots \quad (6)$$

As an example, the case will be considered in which the second-order harmonic of the main magnetic field, i.e., the harmonic which is proportional to $Z^2$ is corrected. Each iron shim 4 is disposed so that the fourth-order harmonics of the magnetic fields which are generated by the surface magnetic charges which appear in end surfaces 4A and 4B are zero, so the following equation is satisfied:

$$\epsilon_4(\theta_1) = \epsilon_4(\theta_2) = 0 \ldots \quad (7)$$

Combining Equations (6) and (7) gives $$\epsilon_4(\theta)=(5/8)S^6U(15S^4-40S^2U^2+8U^4)=0$$

The two values of $\theta$ which satisfy this equation are $$\theta_1\approx 57.42°$$

$$\theta_2\approx 25.02°$$

With these values of $\theta$, the relationship between the length $L_1$ of the iron shim 4 in the direction of the main magnetic field (along the Z axis) and the radius a is $L_1\approx 1.5a$.

Furthermore, if the magnetic field at the other end surface 4B is $B_{z2}$, then from Equation (5), the second-order harmonic $B_z(Z^2)$ of the magnetic field which is generated at the coordinate Z by both end surfaces 4A and 4B of the iron shim 4 is $$B_z(Z^2) = B_{z1} + B_{z2} \qquad (8)$$
$$= B_{zs}(Z/a)^2[\epsilon_2(\theta_1) - \epsilon_2(\theta_2)]$$

In Equation (8), the sign of $\epsilon_2(\theta_1)$ is negative because at end surfaces 4A and 4B, the poles are reversed with respect to one another.

When the iron shim 4 corrects the first-order harmonic $B_z(Z)$ of the main magnetic field, the end surfaces of the shims 4 are positioned such that the third-order harmonics of the magnetic fields which are generated at the coordinate Z by the surface magnetic charges in the end surfaces 4A and 4B are each 0, i.e., such that $\epsilon_3(\theta_1)=\epsilon_3(\theta_2)=0$. At this time, the length $L_1$ of each shim 4 in the direction of the Z axis is $L_1\approx 1.32a$. In addition, when the magnetic field in the X direction is corrected using iron shims which are divided in the circumferential direction, then $L_1\approx 1.15a$.

It can be seen that conventional iron shims for correcting a magnetic field are quite long with respect to their radius. This results in the shims being very large and heavy, and due to their size, the support structure which resists the electromagnetic forces which are exerted on the shims must also be large.

SUMMARY OF THE INVENTION

Accordingly, it is an object of the present invention to provide a magnetic shim for correcting a magnetic field in an NMR apparatus which is smaller and lighter than a conventional shim.

A magnetic shim for correcting the nth order harmonic of a main magnetic field in accordance with this invention is one in which the end surfaces of the shim are positioned such that the (n+2)-order harmonics of the magnetic fields which are generated by the magnetic charges which appear in the end surfaces are not zero and such that their total is equal to zero.

There are an infinite number of choices for the positions of the end surfaces of a shim which satisfy the condition that the total of the (n+2)-order harmonics be zero, so it is possible to choose the positions so that the length of a shim in the direction of the Z-axis is much shorter than that of a conventional shim.

BRIEF DESCRIPTION OF THE DRAWINGS

In the drawings, the same reference numerals indicate the same or corresponding parts.

DESCRIPTION OF THE PREFERRED EMBODIMENT

Figure 3:
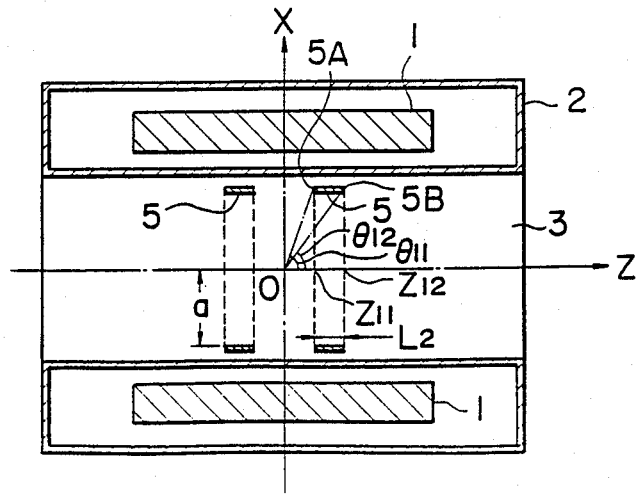
FIG. 3 is a schematic longitudinal cross-sectional view of an NMR apparatus which is equipped with magnetic shims in accordance with the present invention.

Hereinbelow, a preferred embodiment of the present invention will be described while referring to the accompanying drawings, FIG. 3 of which is a longitudinal cross-sectional view of an NMR apparatus which is equipped with magnetic shims 5 according to the present invention. The NMR apparatus illustrated in FIG. 3 is identical to the apparatus illustrated in FIG. 1 with the exception that the shims 5 of the present invention are much shorter than the conventional shims 4 of FIG. 1. The two shims 5 illustrated in FIG. 3 are for correcting the second-order harmonic of the main magnetic field.

The Z coordinates of the end surfaces 5A and 5B of the iron shim 5 are $Z_{11}$ and $Z_{12}$, and the angles between the Z-axis and straight lines which connect end surfaces 5A and 5B with the origin O are $\theta_{11}$ and $\theta_{12}$. The length of each iron shim 5 in the direction of the Z axis is $L_2$.

The total fourth-order harmonic $B_z(Z^4)$ of the magnetic field generated by an iron shim 5 is, from Equation (5), $$B_z(Z^4)=B_{zs}(Z/a)^4[\epsilon_4(\theta_{11})-\epsilon_4(\theta_{12})]\ldots \qquad (9)$$

From Equation (9), it can be seen that in order for the fourth-order harmonic $B_z(Z^4)$ of the magnetic field to be zero, it is merely necessary to satisfy the condition $$\epsilon_4(\theta_{11})-\epsilon_4(\theta_{12})=0$$

Namely, even if the fourth-order harmonic due to surface 5A and the fourth-order harmonic due to surface 5B are not both zero at the coordinate Z, i.e., even if $\epsilon_4(\theta_{11})$ is not equal to 0 and $\epsilon_4(\theta_{12})$ is not equal to 0 the total fourth-order harmonic of the z-component of the magnetic field generated by a shim 5 (the total of the fourth-order harmonic due to surface 5A and the fourth-order harmonic due to surface 5B) will be zero if the following equation is satisfied:

$$\epsilon_4(\theta_{11})=\epsilon_4(\theta_{12})\ldots \qquad (10)$$

Figure 4:
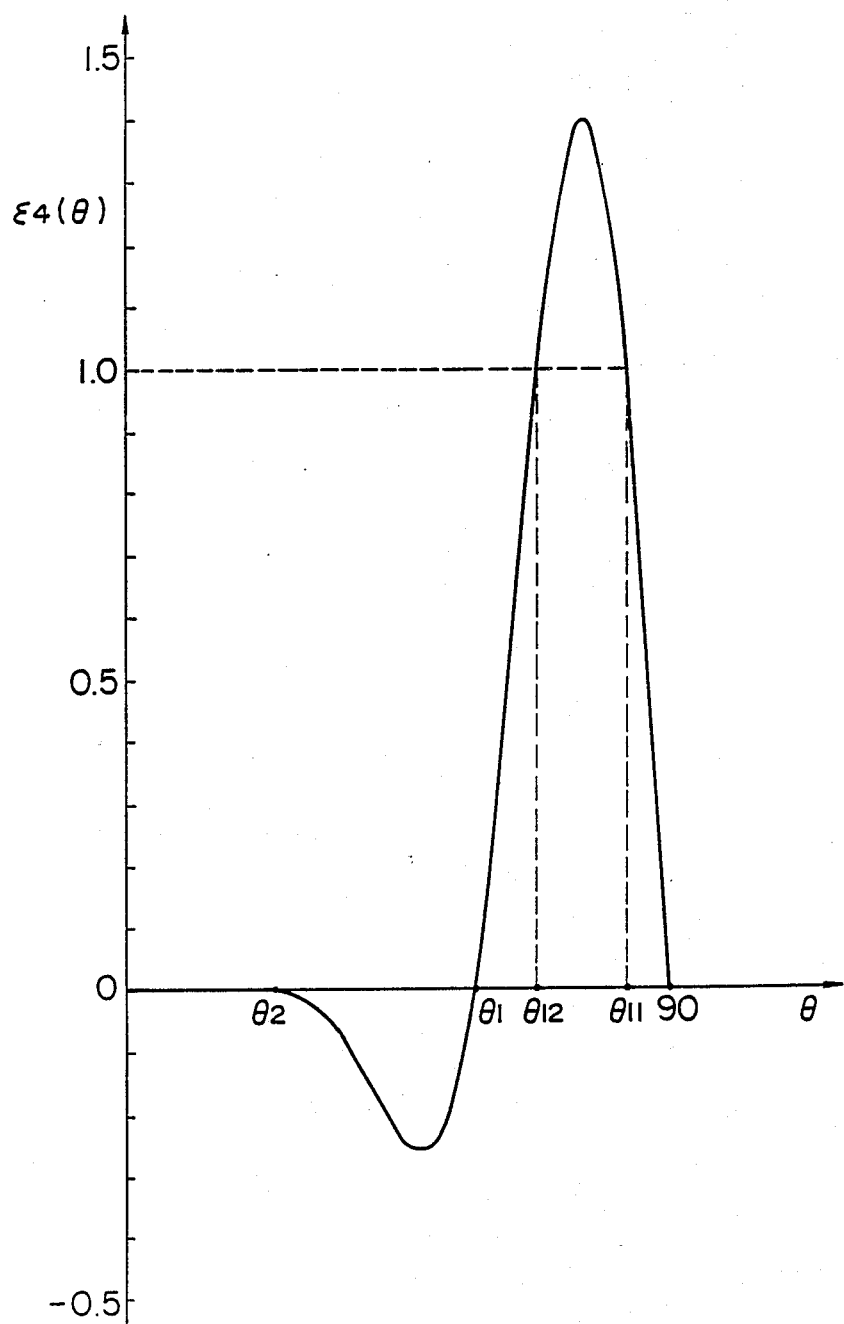
FIG. 4 is a graph of the coefficients $\epsilon_4(\theta)$ of the fourth-order harmonics of the magnetic field generated by a magnetic shim as a function of the angle $\theta$ of a line connecting an end surface of the shim with the origin.

FIG. 4 shows the value of the coefficient $\epsilon_4(\theta)$ of Equation (6) as a function of $\theta$. It can be seen that there are an infinite number of combinations of $\theta_{11}$ and $\theta_{12}$ which satisfy Equation (10). For example, if it is desired to shorten the length $L_2$ of each iron shim 5, $\epsilon_4(\theta)$ can be selected such that $\theta_{11}$ and $\theta_{12}$ are close to one another in magnitude. For example, if $\epsilon_4(\theta_{11})=\epsilon_4(\theta_{12})=1.0$, then $$\theta_{11}\approx 83.16°$$

$$\theta_{12} \approx 68.49°$$

Under these circumstances, the length $L_2$ of each iron shim 5 is $L_2 \approx 0.274a$. This length is much shorter than the length $L_1 = 1.5a$ of the conventional iron shims 4 of FIG. 1.

Figure 1:
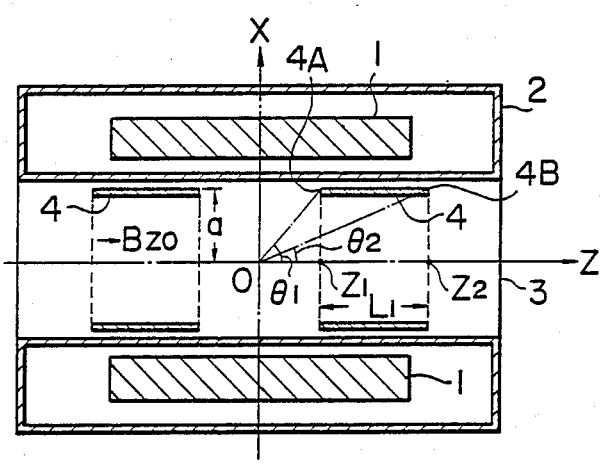
FIG. 1 is a schematic longitudinal cross-sectional view of an NMR apparatus which is equipped with conventional magnetic shims.
Figure 2:
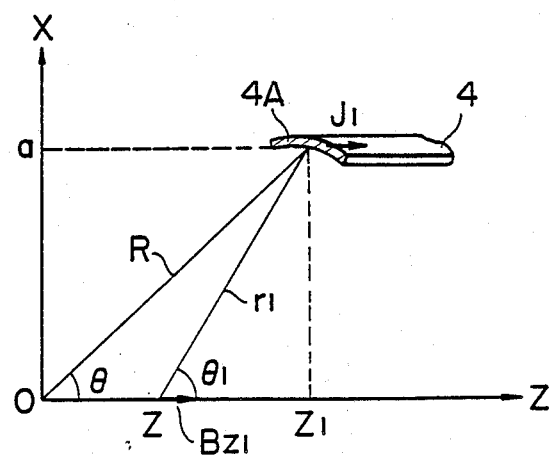
FIG. 2 is a perspective view of a small segment of one end of a magnetic shim.

In the preceding example, the shims 5 were used to correct the second-order harmonic $B_z(Z^2)$ of the main magnetic field $B_z$. If it is desired to instead correct the first-order harmonic of the main magnetic field, then the end surfaces of the shims 5 are positioned such that $\epsilon_3(\theta_{11}) = \epsilon_3(\theta_{12})$. If $\theta_{11}$ and $\theta_{12}$ are set equal to, for example, $$\theta_{11} \approx 63.5°$$

$$\epsilon_{12} \approx 50°.$$

then the length $L_2$ of each shim 5 in the direction of the Z axis will be $L_2 \approx 0.34a$, which is clearly shorter than for the conventional shims (1.32a) of FIG. 1.

To generalize, when a shim 5 is used to correct the nth-order harmonic of the main magnetic field, it is necessary only to position the end surfaces of the shim such that the total of the (n+2)-order harmonics of the magnetic field generated by the shim 5 is zero, i.e., such that $\epsilon_{(n+2)}(\theta_{11}) = \epsilon_{(n+2)}(\theta_{12})$.

In the above-described embodiment, each iron shim 5 is cylindrical and generates a magnetic field in the direction of the Z axis. However, the iron shims 5 may be divided in the circumferential direction into a plurality of sections and generate a magnetic field having a component in the direction of the X axis. In this case, $\theta_{11}$ and $\theta_{12}$ can be set to $\theta_{11} \approx 82.2°$ and $\theta_{12} \approx 60.7°$, for example, and the length $L_2$ in the direction of the Z axis becomes $L_2 \approx 0.42a$, which is clearly shorter than the conventional length (1.15a).

The shim 5 which is employed in the present invention need not be made of iron, and the same effects can be obtained using other magnetic materials.

It can be seen from the preceding explanation that a magnetic shim in accordance with the present invention can be significantly shorter and lighter than a conventional magnetic shim. Therefore, the shim is easier and cheaper to manufacture and install than a conventional magnetic shim. Furthermore, due to its decreased size and weight, the structure for supporting the shim inside an NMR apparatus can be decreased in size and strength, resulting in an overall decrease in the weight of the NMR apparatus.

What is claimed is:

1. A magnetic field correcting magnetic shim for a superconducting magnet apparatus having a superconducting main coil for generating a uniform magnetic field in the vicinity of a central region thereof, a cryostat containing said superconducting main coil therein, and a magnetic field correcting apparatus having a magnetic field correcting shim disposed on a cylindrical surface substantially concentric to said main coil, characterized by:

said magnetic field correcting magnetic shim having two axially spaced end surfaces oriented perpendicular to an axial direction of the coil, a magnetic field generated by a magnetic charge appearing on said end surfaces having a component contributing to an nth-power term of a spherical harmonization function development representing the magnetic field in the axial direction of the coil, and the position of said two end surfaces being selected such that a component contributing to an (n+2)-power term generated by the magnetic charge on each of said end surfaces is non-zero, but the sum of the components contributing to the (n+2)-power term generated by the magnetic charge on said two end surfaces is zero.

2. A magnetic field correcting shim as claimed in claim 1, wherein said magnetic shim is cylindrical.

3. A magnetic field correcting shim as claimed in claim 1, wherein said magnetic shim comprises a plurality of circumferentially divided sections.

* * * * *